(12) United States Patent
Nakayama (10) Patent No.: US 10,403,453 B2
(45) Date of Patent: Sep. 3, 2019

(54) ELECTRONIC DEVICE

(71) Applicant: TEAC CORPORATION, Tokyo (JP)

(72) Inventor: Mikio Nakayama, Tokyo (JP)

(73) Assignee: TEAC CORPORATION, Tokyo (JP)

( * ) Notice: Subject to any disclaimer, the term of this patent is extended or adjusted under 35 U.S.C. 154(b) by 0 days.

(21) Appl. No.: 15/899,553

(22) Filed: Feb. 20, 2018

(65) Prior Publication Data

US 2018/0301298 A1    Oct. 18, 2018

(30) Foreign Application Priority Data

Apr. 18, 2017  (JP) ................................ 2017-081947

(51) Int. Cl.
| | | |
|---|---|---|
| *G06F 3/00* | (2006.01) | |
| *G06F 3/02* | (2006.01) | |
| *G06F 3/16* | (2006.01) | |
| *H01H 9/02* | (2006.01) | |
| *G06F 3/023* | (2006.01) | |
| *G06F 3/038* | (2013.01) | |
| *H03M 11/10* | (2006.01) | |

(Continued)

(52) U.S. Cl.
CPC ........... *H01H 13/807* (2013.01); *G06F 3/002* (2013.01); *G06F 3/023* (2013.01); *G06F 3/0216* (2013.01); *G06F 3/0219* (2013.01); *G06F 3/038* (2013.01); *G06F 3/16* (2013.01); *H01H 9/0235* (2013.01); *H01H 13/702* (2013.01); *H01H 13/785* (2013.01); *G06F 3/0487* (2013.01); *H03M 11/10* (2013.01)

(58) Field of Classification Search
CPC .... H03M 11/10; G06F 3/0487; G06F 3/0216; G06F 3/038; G06F 3/002; G06F 3/0219; G06F 3/023; G06F 3/16; H01H 13/807; H01H 13/702; H01H 13/785; H01H 9/0235

See application file for complete search history.

(56) References Cited

U.S. PATENT DOCUMENTS 5,345,807 A * 9/1994 Butts ................. A47J 27/62
                                                    73/1.15
5,386,251 A * 1/1995 Movshovich ......... H04B 1/202
                                                    340/12.23

(Continued)

FOREIGN PATENT DOCUMENTS

JP         3205777 B1    9/2001
JP      2005-316658 A    11/2005

*Primary Examiner* — Franklin D Balseca
(74) *Attorney, Agent, or Firm* — Seed IP Law Group LLP (57) ABSTRACT

An electronic device is provided that uniformalizes (makes uniform) pressing sensitivities of operation switches such as a plurality of immediate output switches. A system includes a PC which is connected to a communication line, and an audio interface device which is connected to the PC and which has an immediate output switch which outputs to the PC a reproduction start command signal of an audio file which is assigned in advance, according to a user operation. A processor of the audio interface device converts an output value of the immediate output switch using a conversion table to a level value among a plurality of levels, and outputs the converted value. The conversion table is a table which converts different output values of the immediate output switch for the same pressing force into the same level value.

5 Claims, 5 Drawing Sheets

(51) Int. Cl.
  *G06F 3/0487* (2013.01)
  *H01H 13/702* (2006.01)
  *H01H 13/785* (2006.01)
  *H01H 13/807* (2006.01)

(56) References Cited

U.S. PATENT DOCUMENTS

| | | |
|---|---|---|
| 6,509,848 B1 | 1/2003 | Ogata et al. |
| 6,717,568 B1 | 4/2004 | Takatuka et al. |
| 9,134,807 B2 * | 9/2015 | Shaw .................. G06F 1/1618 |
| 9,690,389 B2 * | 6/2017 | Hood, III .................. G06F 3/02 |
| 9,899,162 B2 * | 2/2018 | Chen .................. H01H 13/7065 |
| 2011/0001641 A1 * | 1/2011 | Tung .................. G06F 3/0238 |
| | | 341/23 |
| 2013/0291708 A1 * | 11/2013 | Orshan .................. G10H 1/02 |
| | | 84/626 |

* cited by examiner

| | L0 | L1 | L2 | ... | L255 |
|---|---|---|---|---|---|
| PON1 | 65-70 | 71-76 | ... | ... | ... |
| PON2 | 70-75 | 76-81 | ... | ... | ... |
| PON3 | 90-95 | 96-101 | ... | ... | ... |

ELECTRONIC DEVICE

CROSS REFERENCE TO RELATED APPLICATION

The disclosure of Japanese Patent Application No. 2017-081947 filed on Apr. 18, 2017, including the specification, claims, drawings, and abstract, is incorporated herein by reference in its entirety.

TECHNICAL FIELD

The present disclosure relates to an electronic device, and in particular, to an electronic device having an operation switch having a pressure-sensing element.

BACKGROUND

In the related art, there is proposed a calibration technique of a pressure switch equipped on an electronic device.

JP 3205777 B discloses a calibration function of an analog switch unit which uses a resistive pressure-sensing element which outputs signals of different levels according to a pressing force, and discloses that an upper limit and a lower limit of an analog output signal which is output from the analog switch unit are corrected to calibrated levels.

JP 2005-316658 A discloses calibration of a key switch, and that an output of a pressure-sensing device is corrected such that a signal of a given level is output when a pressing force for pressing the key switches at different positions are identical to each other.

There is also proposed a technique in which, for example, an audio interface device and a computer are connected, various audio signals are captured from the audio interface and supplied to the computer, and the computer suitably edits the audio signals or the like and records the sound, or outputs to the outside via the Internet (Internet live broadcasting).

In such an audio system, it is desirable, from the viewpoint of improving maneuverability, that an audio file to be reproduced and output is assigned in advance to a sound reproduction switch provided on the audio interface device (hereinafter referred to as "immediate output" or "PON" switch), and that, with a pressing operation of the immediate output switch, the assigned audio file is immediately reproduced and output. In order to assign an audio file to the immediate output switch in advance, for example, a virtual immediate output switch corresponding to the physical immediate output switch of the audio interface device may be displayed on the computer, and an audio file may be dragged and dropped to the virtual immediate output switch, to thereby assign the audio file to the immediate output switch.

When the desired audio file is reproduced and output in response to the pressing operation of the immediate output switch, it is desirable that, in addition to reproducing and outputting a particular audio file, it is possible to reproduce with a volume or the like corresponding to the pressing force. On the other hand, a problem may arise when there exist a plurality of immediate output switches, and a sensitivity with respect to the pressing force of each immediate output switch (pressure sensitivity) differs or varies among the immediate output switches. When the pressing sensitivity differs among the immediate output switches, even if the user intends to operate at the same pressing force, the volume becomes different depending on the immediate output switch, and unified operation by the user cannot be achieved. Even when the volume or the like is not set by the pressing force, if the pressing sensitivity differs, there may be caused cases in which, with a particular pressing force, a certain immediate output switch may respond, but another immediate output switch does not respond, or the like, which also makes unified operation impossible. Therefore, it is necessary to uniformalize (make uniform) the pressing sensitivity even when the pressing sensitivities of a plurality of immediate output switches differ from each other.

SUMMARY

The present disclosure provides a technique which can uniformalize the pressing sensitivity of a plurality of operation switches such as the immediate output switch even when the pressing sensitivity differs among the operation switches.

According to one aspect of the present disclosure, there is provided an electronic device comprising an operation switch having a pressure-sensing element, comprising: a first operation switch that outputs a first output value according to a pressing force of a pressing operation by a user; a second operation switch that outputs a second output value according to a pressing force of a pressing operation by the user; and a controller that converts each of the first output value and the second output value to a level value among a plurality of levels using a conversion table. The conversion table is a table which converts the first output value and the second output value for a same pressing force to the same level value.

According to another aspect of the present disclosure, the controller creates the conversion table using at least two first output values when at least two predetermined pressing forces are applied to the first operation switch, and at least two second output values when at least two predetermined pressing forces are applied to the second operation switch.

According to another aspect of the present disclosure, the electronic device further comprises a display that displays a notification that the conversion table has been created, in response to a particular operation by the user.

According to another aspect of the present disclosure, the first operation switch and the second operation switch are immediate output switches that output to the computer a reproduction start command signal of an audio file which is assigned in advance.

According to the present disclosure, even when the pressing sensitivities of at least the first operation switch and the second operation switch differ from each other, the output may be corrected and output such that the same level value is output for the same pressing force. With such a configuration, even when the pressing sensitivities of the first operation switch and the second operation switch differ from each other, the user can operate in a uniformalized manner with the same feel of operation.

BRIEF DESCRIPTION OF DRAWINGS

Embodiment(s) of the present disclosure will be described by reference to the following figures, wherein.

DESCRIPTION OF EMBODIMENTS

<Structure>

An embodiment of the present disclosure will now be described by reference to the drawings, and exemplifying an audio device as an electronic device.

Figure 1:
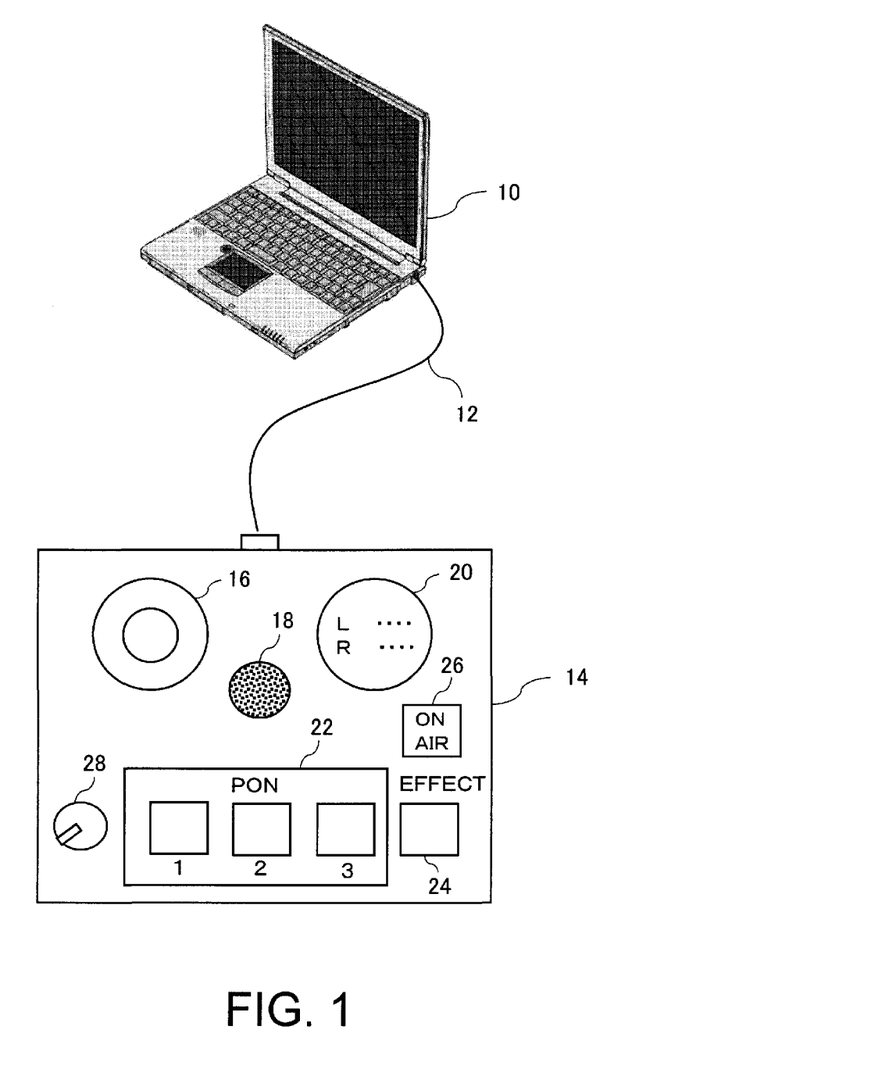
FIG. 1 is a system structural diagram according to an embodiment of the present disclosure.

FIG. 1 is a system structural diagram of an embodiment of the present disclosure. An audio system according to the present embodiment comprises a personal computer (PC) 10 and an audio interface device 14. The PC 10 and the audio interface device 14 are connected to each other, for example, by a USB cable 12, in a manner to allow mutual transmission and reception of data.

In the PC 10, software for inputting, editing, and outputting audio data are installed, and input, output, and editing of the audio data are executed using the software.

The audio interface device 14 is an electronic device in the present embodiment, and functions as an audio device. The audio interface device 14 comprises an amplifier, and analog input terminals and analog output terminals of a plurality of channels, and transmits and receives an audio signal and various control signals to and from the PC 10. The audio interface device 14 comprises a microphone input terminal 16, a built-in microphone 18, a level meter 20, and a headphone output adjustment button 28, and further comprises an immediate output (PON) switch 22 comprising a plurality of buttons, an effect switch 24 which generates various sound effects, and an on-air switch 26.

The immediate output switch 22 comprises three immediate output switches including "immediate output 1," "immediate output 2," and "immediate output 3." When the user presses the immediate output switch 22, the audio interface device 14 supplies a reproduction and output command signal to the PC 10, and the PC 10 reproduces and outputs an audio signal according to the reproduction and output command signal. When the PC 10 is connected to the Internet and the audio signal reproduced by the PC 10 can be output to the outside via the Internet (Internet live broadcasting), with the user operating the immediate output switch 22 while the on-air switch 26 is in an ON state, the audio signal is reproduced and output to the Internet. Desired audio files may be assigned in advance to the three switches of the immediate output switch 22; that is, the "immediate output 1," the "immediate output 2," and the "immediate output 3." The user can press one of the three immediate output switches; that is, the "immediate output 1," the "immediate output 2," and the "immediate output 3," to control the PC 10 to reproduce and output the audio file which is assigned in advance.

The effect switch 24 is a switch for adding a predetermined sound effect to the audio signal. The predetermined sound effect may be arbitrary, and, for example, the process may be a process to add a reverb (reverberation sound).

The on-air switch 26 is a switch for instructing the PC 10 to output in real time via the Internet. By the user operating the on-air switch 26 to the ON state, for example, it becomes possible to output an audio signal, which is input from the microphone input terminal 16, from the PC 10 to the Internet, or to reproduce the audio file assigned in advance to the "immediate output 1" and to output to the Internet by the user operating the "immediate output 1."

Figure 2:
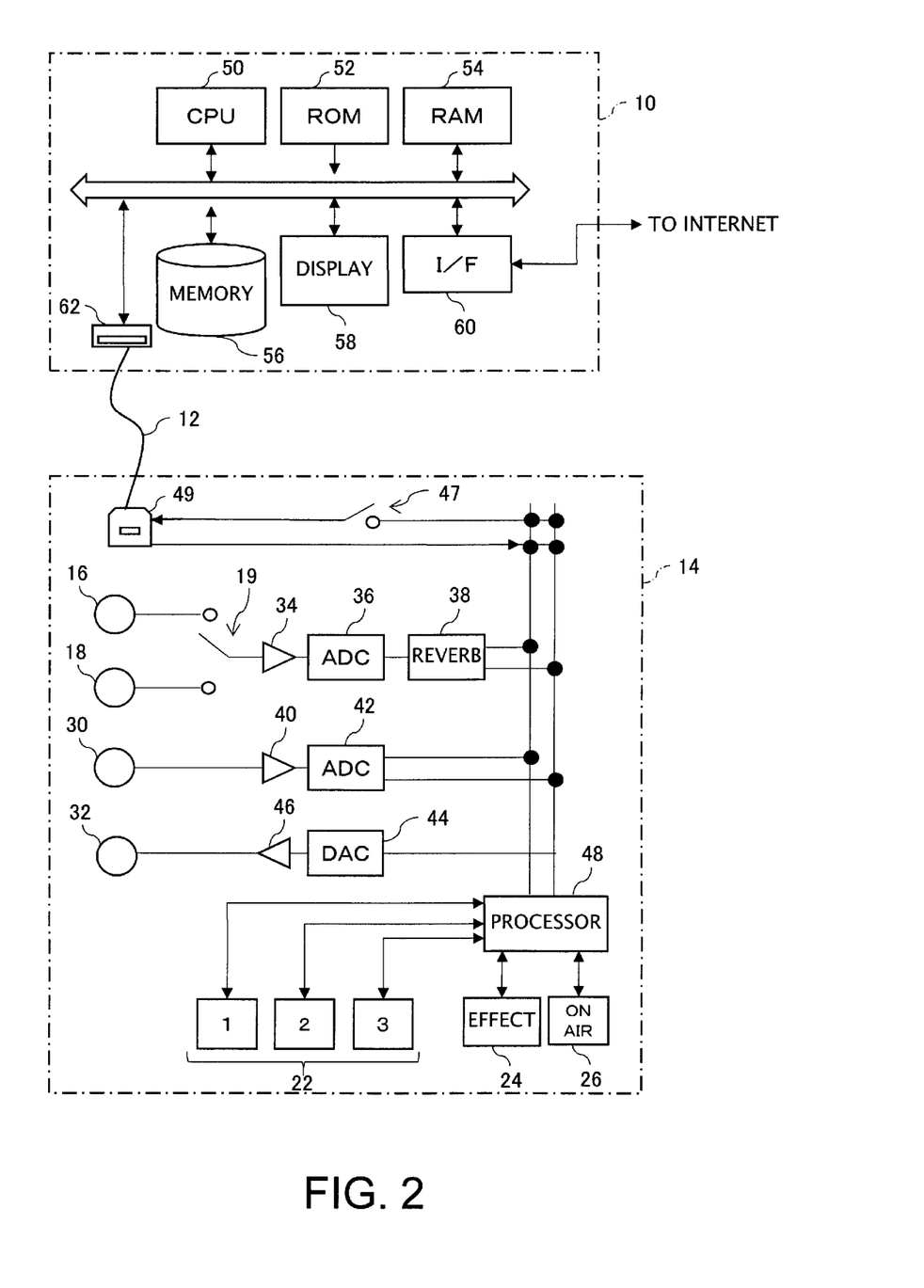
FIG. 2 is a structural block diagram according to an embodiment of the present disclosure.

FIG. 2 is a structural block diagram of the audio system according to the present embodiment.

The PC 10 comprises a CPU 50, a ROM 52, a RAM 54, a memory 56, a display 58, a communication interface I/F 60, and a USB connector 62. In addition to these elements, the PC 10 comprises a known input/output interface such as a mouse, a keyboard, or the like.

The CPU 50 reads a processing program stored in the ROM 52 or in a hard disk drive, or the like, and realizes various functions of the present embodiment by executing the processing program using the RAM 54 as a working memory.

The memory 56 stores the audio file and other files. A format of the audio file is arbitrary, and is, for example, WAV or MP3. The other files are also arbitrary, and may be document data, image data, or video image data.

The display 58 displays various information based on a control command from the CPU 50. In the present embodiment, the display 58 displays virtual switches corresponding to the switches of the audio interface device 14; more specifically, the immediate output switch 22, the effect switch 24, and the on-air switch 26, to achieve a cooperative operation with the audio interface device 14.

The communication interface I/F 60 is an interface for connecting to the Internet serving as a communication line. The connection with the Internet may be wired or wireless.

The USB connector 62 is a connector for USB-connecting to the audio interface device 14. In the drawings, connection with a USB connector 49 on the side of the audio interface device 14 via the USB cable 12 is schematically shown.

The CPU 50 assigns audio files desired by the user to the three switches of the immediate output switch 22 in advance, according to a user operation. Specifically, the CPU 50 correlates one of the files stored in the memory 56 and one of the switches of the immediate output switch 22 according to the user operation. For example, the CPU 50 correlates an audio file of "AAA.WAV" stored in the memory 56 to the "immediate output 1," and an audio file of "BBB.WAV" to the "immediate output 2." Here, "correlation" specifically refers to a process of registering a path of the audio file to the "immediate output 1." The user may cause, for example, a list of files stored in the memory 56 to be displayed on the display 58, and may assign (correlate) a desired audio file to the immediate output switch by dropping an icon of the desired audio file to the virtual switch corresponding to immediate output switch 22 by a drag-and-drop operation or the like.

The CPU 50 also supplies data showing the assignment state to the USB-connected audio interface device 14. With this process, the assignment state is shared between the PC 10 and the audio interface device 14.

The audio interface device 14 comprises, in addition to the microphone input terminal 16, the built-in microphone 18, the immediate output switch 22, the effect switch 24, and the on-air switch 26 described above, an external input terminal 30, an output terminal 32, selection switches 19 and 47, amplifiers 34, 40, and 46, analog-to-digital converters (ADCs) 36 and 42, a digital-to-analog converter (DAC) 44, a reverb adder (REVERB) 38, and a processor 48.

Audio signals which are input from the microphone input terminal 16 and the built-in microphone 18 are selectively switched by the selection switch 19, and are converted into digital audio signals by the ADC 36 through the amplifier 34. To the digital audio signal, the reverb is suitably added by the reverb adder 38 according to an operation of the effect switch 24 by the user, and the digital audio signal is output to a stereo bus. An audio signal which is input from the external input terminal (AUX IN) 30 is converted into a digital audio signal by the ADC 42 through the amplifier 40, and is output to the stereo bus.

The audio signals which are input from the microphone input terminal 16, the built-in microphone 18, and the external input terminal 30, or the audio signals which are supplied from the PC 10 are converted into analog audio signals by the DAC 44 through the stereo bus, and are output from the output terminal 32 such as a headphone terminal or the like through the amplifier 46. A gain of the amplifier 46 is adjusted by the headphone output adjustment button 28.

The USB connector 49 for connecting to the PC 10 is connected to the stereo bus through the selection switch 47. The selection switch 47 cooperates with the on-air switch 26. When the on-air switch 26 is operated to the ON state, a connection point is switched ON, and the output of the audio signal from the audio interface device 14 to the PC 10 is started. On the other hand, regardless of the operation of the on-air switch 26, the control signal from the PC 10 to the audio interface device 14 is supplied to the processor 48.

The processor 48 controls operations of various parts of the audio interface device 14. The processor 48 controls the operations according to the operation signals from the immediate output switch 22, the effect switch 24, and the on-air switch 26. Specifically, the processor 48 outputs a reproduction command signal to the PC 10 in response to the operation signal from the immediate output switch 22. When the "immediate output 1" of the immediate output switch 22 is pressed, a reproduction command signal for the "immediate output 1" is output, when the "immediate output 2" is pressed, a reproduction command signal for the "immediate output 2" is output, and when the "immediate output 3" is pressed, a reproduction command signal for the "immediate output 3" is output. The reproduction command signal includes a level signal corresponding to the pressing force when the immediate output switch 22 is pressed. The level signal is a signal which controls the volume when the audio file is reproduced and output. In addition to the volume, the effect or the tune may be controlled according to the pressing force. When the CPU 50 of the PC 10 receives these reproduction command signals, the CPU 50 reproduces the audio file which is assigned to the "immediate output 1," the "immediate output 2," or the "immediate output 3" in advance, and outputs the audio file in a volume level corresponding to the pressing force. Further, the CPU 50 activates the reverb adder 38 to add the reverb in response to the operation signal from the effect switch 24. Moreover, the CPU 50 outputs a signal output start (broadcast start) command signal or a signal output stop (broadcast stop) command signal to the PC 10 in response to the operation signal from the on-air switch 26, and controls switching ON and OFF of the selection switch 47.

<Assignment of Audio File>

Figure 3:
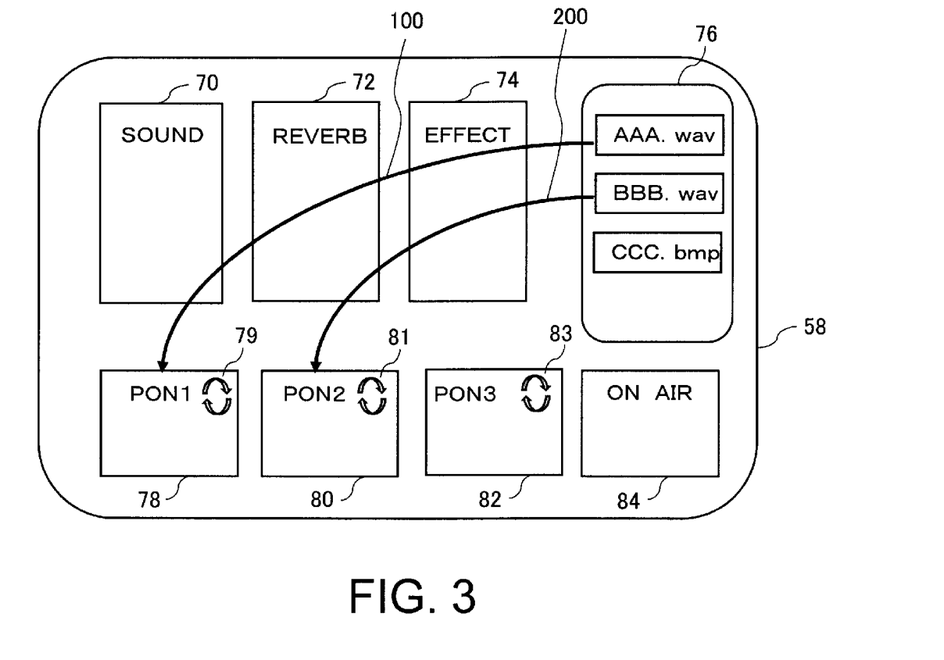
FIG. 3 is an explanatory diagram of assignment of audio files in an embodiment of the present disclosure.

FIG. 3 is a schematic diagram showing assignment of a desired audio file to the immediate output switch 22 by the user on the PC 10.

The CPU 50 of the PC 10 displays on the display 58 a screen shown in FIG. 3 by executing a processing program. On the screen, virtual switches 78, 80, and 82 respectively corresponding to the three switches of the physical immediate output switch 22 of the audio interface device 14; that is, the "immediate output 1," the "immediate output 2," and the "immediate output 3," are displayed, and a virtual switch 84 corresponding to the physical on-air switch 26 of the audio interface device 14 is displayed. Icons 79, 81, and 83 at a top right of the respective virtual switches 78, 80, and 82 are icons for instructing a repeated reproduction (repeat) of the assigned audio file. Display portions 70, 72, and 74 for displaying the volume (weak talk, strong talk, weak sing, strong sing, or the like), the reverb, and the effect (effects other than reverb) are also displayed. In addition, a list 76 of various files stored in the memory 56 is displayed. The file list 76 may be a list displayed on Explorer of Windows (registered trademark).

The user selects a file to be assigned to the immediate output switch 22 from among the files displayed in the file list 76, and assigns the file to one of the virtual switches 78~82 by a drag-and-drop operation. Alternatively, a configuration may be employed in which, when the virtual switches 78~82 are pressed, a file selection screen (such as the file list 76, a tree screen such as Explorer, or the like) is displayed.

For example, when an audio file, "AAA.wav," is to be assigned to the "immediate output 1," the audio file, "AAA.wav" is dragged and dropped to the virtual switch 78 corresponding to the "immediate output 1." In the drawings, an arrow 100 represents the drag-and-drop operation of the audio file, "AAA.wav," to the virtual switch 78. When an audio file, "BBB.wav," is to be assigned to the "immediate output 2," the audio file, "BBB.wav," is dragged and dropped to the virtual switch 80 corresponding to the "immediate output 2." In the drawings, an arrow 200 shows the drag-and-drop operation of the audio file, "BBB.wav," to the virtual switch 80.

When a file is assigned by the drag-and-drop operation, the CPU 50 may judge whether or not the assignment is normal, and may display a result of the judgment on the display 58.

The three immediate output switches 22; that is, the "immediate output 1," the "immediate output 2," and the "immediate output 3," are analog operation switches each having a resistive pressure-sensing element, output voltage signals corresponding to the pressing forces, and supply the signals to the processor 48. The processor 48 converts the voltage signal from the immediate output switch 22 into a digital value by an ADC (analog-to-digital converter) which is built in or which is external to the device, evaluates, for example, the digital value in a total of 256 levels from level 0 (L0) to level 255 (L255), and reproduces and outputs the audio file with a volume corresponding to the evaluated level. When the sensitivities of the resistive pressure-sensing elements of the three analog operation switches of the "immediate output 1," the "immediate output 2," and the "immediate output 3" are approximately equal to each other, there is no problem. However, when there is a variation in the sensitivities, as described before, it becomes impossible for the user to operate in a uniformalized manner, and the manipulation is reduced. In particular, when the sensitivity for the minimum pressing force differs between outputs, for example, a case may be caused in which, with the same minimum pressing force, although the operation of the "immediate output 1" may be responded, no response is given to the operation of the "immediate output 2,", resulting in uneasy feeling in manipulation.

In consideration of this, the processor 48 of the audio interface device 14 executes a process to uniformalize the pressing sensitivity by absorbing the difference in the pressing sensitivities, even when the pressing sensitivities differ from each other due to a characteristic variation in the resistive pressure-sensing elements of the "immediate output 1," the "immediate output 2," and the "immediate output 3."

Next, the uniformalization process (calibration process) of the pressing sensitivities will be described.

<Uniformalization Process of Pressing Sensitivity>

Figure 4:
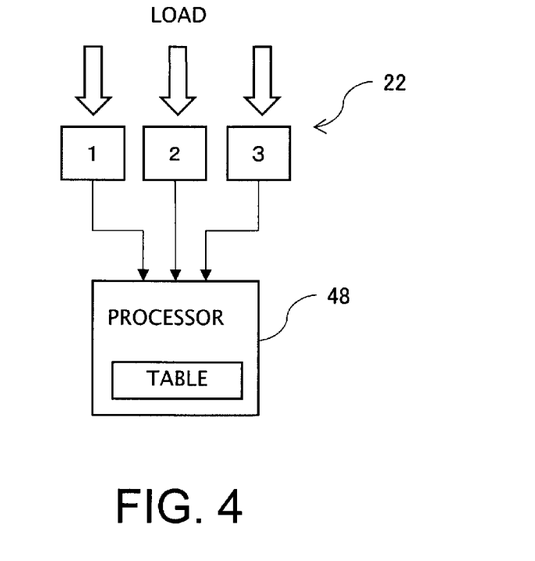
FIG. 4 is an explanatory diagram of application of a load in an embodiment of the present disclosure.

FIG. 4 schematically shows the uniformalization process of the pressing sensitivity. For example, at the time of product shipping of the audio interface device 14, a particular jig for applying a load is prepared, the immediate output switch 22 of the audio interface device 14 is positioned with respect to the jig, a first predetermined load (for example, 1000 g) is respectively applied to the switches including the "immediate output 1," the "immediate output 2," and the "immediate output 3" using the particular jig, and an output voltage signal at this point is supplied to the processor 48.

The processor 48 converts the output voltage signal to a digital value by an ADC, and stores in the memory as an output value when the first load is applied. Next, again using the particular jig, a second predetermined load (for example, 400 g) is applied to the switches including the "immediate output 1," the "immediate output 2," and the "immediate output 3," and an output voltage signal at this point is supplied to the processor 48. The processor 48 converts the output voltage signal into a digital value, and stores the same in the memory as an output value when the second load is applied.

The processor 48 interpolates an output value at a load between the first load and the second load using a predetermined interpolation formula and using the output value when the first load is applied and the output value when the second load is applied for the switches including the "immediate output 1," the "immediate output 2," and the "immediate output 3," to calculate a pressing sensitivity characteristic. For each of the "immediate output 1," the "immediate output 2," and the "immediate output 3," the output value is classified into one of 256 levels from L0 to L255. In this process, a level according to the output value is correlated so that the same level is assigned for the same load, and the correlation is stored in the memory as a conversion table for each switch. The classification levels (the number of classifications) and resolution of the output value may be arbitrarily changed according to the desired system.

Figure 5:
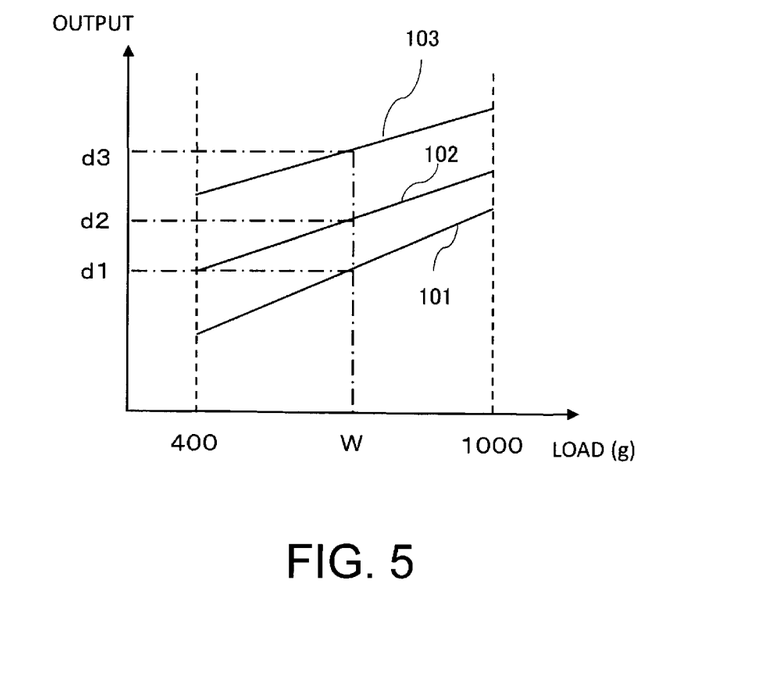
FIG. 5 is a pressing sensitivity characteristic diagram of each immediate output switch in an embodiment of the present disclosure.

FIG. 5 schematically exemplifies the pressing sensitivity characteristics of the switches including the "immediate output 1," the "immediate output 2," and the "immediate output 3."

In FIG. 5, a horizontal axis represents the load (g), and a vertical axis represents an output value in which the output voltage signal which is output from each immediate output switch is converted into a digital value. A straight line 101 shows a pressing sensitivity characteristic for the "immediate output 1," a straight line 102 shows a pressing sensitivity characteristic for the "immediate output 2," and a straight line 103 shows a pressing sensitivity characteristic for the "immediate output 3." The processor 48 acquires the output values at the loads of 400 g and 1000 g, and linearly interpolates the output values between these two points for each of the outputs, to calculate the pressing sensitivity characteristics 101, 102, and 103.

Next, the processor 48 creates conversion tables for the "immediate output 1," the "immediate output 2," and the "immediate output 3," such that an output value d1 of the "immediate output 1," an output value d2 of the "immediate output 2," and an output value d3 of the "immediate output 3" at an arbitrary load W between the load of 400 g and the load of 1000 g correspond to the same level Ld in the 256 levels from L0 to L255. The conversion table is a table which correlates the output value and the level, and a level L is uniquely correlated to an output value. A method of creating the conversion table is arbitrary. For example, the conversion table is created by setting the pressing sensitivity characteristic 101 for the "immediate output 1" as a reference, and matching the pressing sensitivity characteristics 102 and 103 for the other switches, the "immediate output 2" and the "immediate output 3," with this pressing sensitivity characteristic for the "immediate output 1." Specifically, the output values for the loads of 400 g to 1000 g of the pressing sensitivity characteristic 101 for the "immediate output 1" are equally classified in 256 levels, and these values are set as the conversion table for the "immediate output 1." With this process, for example, the output value d1 is classified to L100 among the 256 levels from L0 to L255. In this case, the processor 48 equally classifies the output values for the loads from 400 g to 1000 g for the pressing sensitivity characteristic 102 for the "immediate output 2" into 256 levels, and creates the conversion table for the "immediate output 2" such that the output value d2 is classified to L100. Similarly, the output values for the loads of 400 g to 1000 g for the pressing sensitivity characteristic 103 for the "immediate output 3" are equally classified in 256 levels, and the processor 48 creates the conversion table for the "immediate output 3" such that the output value d3 is classified to L100.

Figure 6:
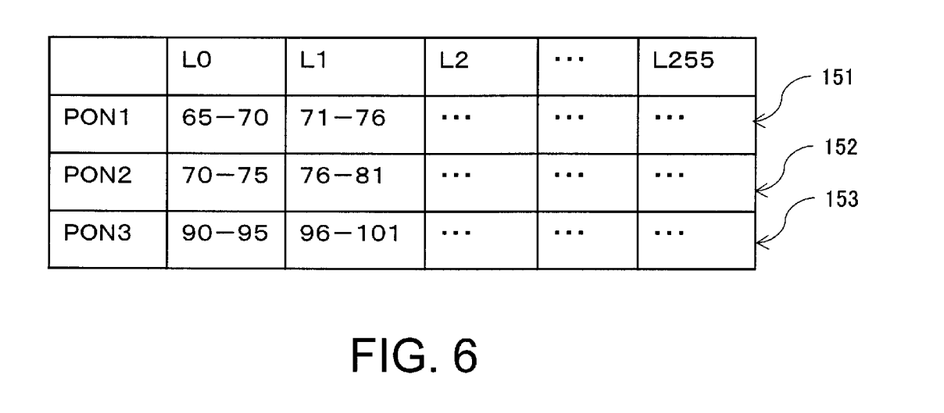
FIG. 6 is an explanatory diagram of a conversion table in an embodiment of the present disclosure.

FIG. 6 shows examples of an "immediate output 1" (PON1) conversion table 151, an "immediate output 2" (PON2) conversion table 152, and an "immediate output 3" (PON3) conversion table 153.

The "immediate output 1" conversion table 151 converts the output value to the level by correlating the output values of the "immediate output 1" and the levels. The conversion table 151 converts the output values of 65 to 70 to L0, the output values of 71 to 76 to L1, etc.

The "immediate output 2" conversion table 152 converts the output value to the level by correlating the output values of the "immediate output 2" and the levels. The conversion table 152 converts the output values of 70 to 75 to L0, the output values of 76 to 81 to L1, etc.

The "immediate output 3" conversion table 153 converts the output value to the level by correlating the output values of the "immediate output 3" and the levels. The conversion table 153 converts the output values of 90 to 95 to L0, the output values of 96 to 101 to L1, etc.

Even when the output values at a certain load (for example, 500 g) are 71 for the "immediate output 1," 76 for the "immediate output 2," and 100 for the "immediate output 3," and the pressing sensitivities for the resistive pressure-sensing elements differ from each other, the output values may be converted into levels through the conversion tables 151, 152, and 153, so that the output values for all immediate outputs can be set at the same level, L1, and the pressing sensitivity can thus be uniformalized.

Alternatively, in place of setting the pressing sensitivity characteristic 101 for the "immediate output 1" as the reference, the pressing sensitivity characteristic 102 for the "immediate output 2" or the pressing sensitivity characteristic 103 for the "immediate output 3" may be set as the reference. Further alternatively, in place of setting one of the pressing sensitivity characteristics 101, 102, and 103 as the reference, another pressing sensitivity characteristic may be set as the reference. For example, an average pressing sensitivity characteristic of the pressing sensitivity characteristics 101, 102, and 103 may be calculated and set as the reference.

Figure 7:
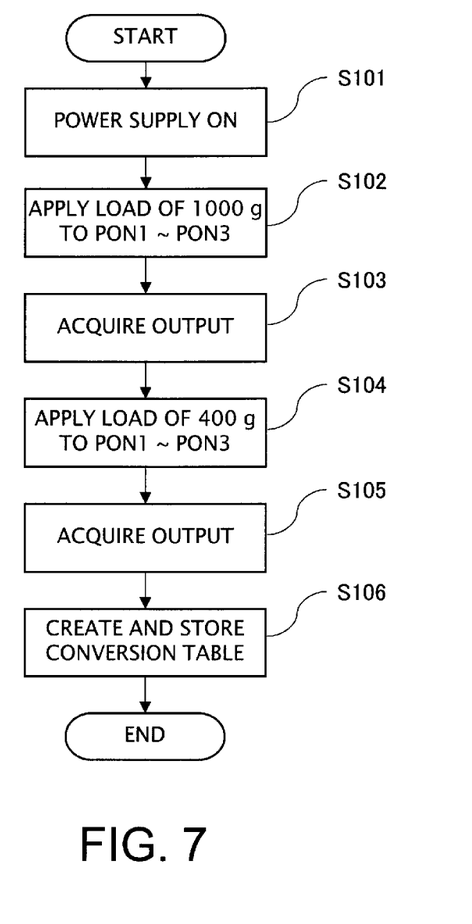
FIG. 7 is a process flowchart in an embodiment of the present disclosure.

FIG. 7 is a processing flowchart of the pressing sensitivity uniformalization process in the processor 48.

When a power supply of the audio interface device 14 is switched ON (S101), the processor 48 is started up, and the pressing sensitivity uniformalization process is started.

Specifically, using the particular jig, the first predetermined load (1000 g) is applied to the "immediate output 1," the "immediate output 2," and the "immediate output 3"(S102). The load may be applied simultaneously or sequentially. The operation switches including the "immediate output 1," the "immediate output 2," and the immediate output 3" supply voltage signals corresponding to the load to the processor 48. While the load may be applied by an operator, with the use of the particular jig, an accurate load can be applied, and an accurate conversion table can be created.

The processor 48 acquires the voltage signals from the operation switches including the "immediate output 1," the "immediate output 2," and the "immediate output 3," converts the voltage signals into digital values, and stores the same in the memory (S103).

Next, using the particular jig, the second predetermined load (400 g) is applied to the "immediate output 1," the "immediate output 2," and the "immediate output 3" (S104). The load may be applied simultaneously or sequentially. The operation switches including the "immediate output 1," the "immediate output 2," and the "immediate output 3" supply voltage signals corresponding to the load to the processor 48.

The processor 48 acquires the voltage signals from the operation switches including the "immediate output 1," the "immediate output 2," and the "immediate output 3," converts the signals into digital values, and stores the same in the memory (S105).

After acquiring the output values at two loads for the operation switches including the "immediate output 1," the "immediate output 2," and the "immediate output 3," the processor 48 creates the conversion tables for the "immediate output 1," the "immediate output 2," and the "immediate output 3" using these output values, and stores the same in the memory (S106). The memory is desirably a non-volatile memory which can be rewritten, such as a flash memory, but is not limited to the non-volatile memory.

The uniformalization process is completed in the manner described above, and the product is shipped. After the shipping, when the user presses the "immediate output 1," the processor 48 uses the conversion table for the "immediate output 1" stored in the memory, to convert the output value to one level among the 256 levels from L0 to L255, and outputs the same to the PC 10. When the user presses the "immediate output 2," the processor 48 uses the conversion table for the "immediate output 2" stored in the memory, to convert the output value into one level among the 256 levels from L0 to L255, and outputs the same to the PC 10. When the user presses the "immediate output 3," the processor 48 uses the conversion table for the immediate output 3 stored in the memory, to convert the output value to one level among the 256 levels from L0 to L255, and outputs the same to the PC 10.

When the uniformalization process is started in the processor 48, the process may be started with a particular operation of the audio interface device 14 as a trigger. For example, a configuration may be employed in which, in S101, when the user switches the power supply switch ON and presses both the effect switch 24 and the on-air switch 26, the processor 48 detects these operations and starts execution of the uniformalization process. Alternatively, a dedicated switch for "calibration" may be provided, and the pressing of the calibration switch may be used as the trigger. However, as such a switch is in principle an unnecessary switch for the product user, it is desirable to use a combination of a plurality of switches which can be used in principle by the user as the triggering operation.

When the uniformalization process is executed and the conversion table for the "immediate output 1," the conversion table for the "immediate output 2," and the conversion table for the "immediate output 3" are created and stored in the memory, a display may be presented to the user in response to a particular operation by the user, showing that the uniformalization process has already been executed. For example, when the power supply switch is switched ON and the on-air switch 26 and the immediate output 3 are pressed, the level meter 20 may be selectively lighted, to show that the uniformalization process is completed and the conversion tables are created.

An embodiment of the present disclosure has been described. The present disclosure, however, is not limited to the above-described embodiment, and various modifications may be made. Alternative configurations will now be described.

<Alternative Configuration 1>

In the embodiment, the pressing sensitivity uniformalization process has been described for three immediate output switches including the "immediate output 1," the "immediate output 2," and the "immediate output 3." Alternatively, the pressing sensitivity uniformalization process may be selectively executed for a combination of the "immediate output 1" and the "immediate output 2," a combination of the "immediate output 2" and the "immediate output 3," or a combination of the "immediate output 1" and the "immediate output 3." In summary, the pressing sensitivity uniformalization process may be executed for two or more operation switches. When the "immediate output 1" and the "immediate output 2" are targeted, the "immediate output 1" corresponds to a first operation switch, and the "immediate output 2" corresponds to a second operation switch. Similarly, when the "immediate output 2" and the "immediate output 3" are targeted, the "immediate output 2" corresponds to the first operation switch, and the "immediate output 3" corresponds to the second operation switch. Further, the pressing sensitivity uniformalization process may be executed not only for the immediate output switch 22, but also for switches including the other analog operation switches (for example, the effect switch 24 and the on-air switch 26). Alternatively, the user may arbitrarily group the operation switches for which the pressing sensitivity uniformalization process is to be executed, and the uniformalization process may be executed in similar steps for the grouped operation switches. Alternatively, the grouped switches may be displayed on the level meter 20 or the PC 10.

Further, a configuration may be employed in which the grouped operation switches can be ungrouped. For example, after the pressing sensitivity uniformalization process is executed by grouping the "immediate output 1," the "immediate output 2," and the "immediate output 3," the "immediate output 3" may be ungrouped, and may be returned to the original pressing sensitivity. In this case, the processor 48 discards and does not use the conversion table for the "immediate output 3" stored in the memory, and instead uses a default conversion table.

<Alternative Configuration 2>

In the embodiment, a display is presented in response to a particular operation, showing that the pressing sensitivity uniformalization process is already executed. Alternatively, the display may be presented on the level meter 20 and also on the PC 10. When the display is to be shown on the level meter 20, for example, LEDs corresponding respectively to the "immediate output 1," the "immediate output 2," and the "immediate output 3" may be lighted, to display that the pressing sensitivity uniformalization process is already executed for the "immediate output 1," the "immediate output 2," and the "immediate output 3," or the LEDs corresponding respectively to the "immediate output 1" and the "immediate output 2" may be lighted without lighting the LED corresponding to the "immediate output 3," to show that the pressing sensitivity uniformalization process is already executed for the "immediate output 1" and the "immediate output 2."

<Alternative Configuration 3>

In the embodiment, the output values when the first predetermined load (1000 g) and the second predetermined load (400 g) are applied to the immediate output switch 22 are used to calculate the pressing sensitivity of the immediate output switch 22 (refer to FIG. 5). The interpolation of the output values between the two loads does not need to be the linear interpolation, and may alternatively be a non-linear interpolation using a second-order function or a higher-order function. Alternatively, in addition to the first predetermined load and the second predetermined load, an output value when a third predetermined load is applied may be used to calculate the pressing sensitivity. In summary, the pressing sensitivity may be calculated using output values when at least two predetermined loads are applied. The two predetermined loads desirably correspond to a minimum pressing force and a maximum pressing force.

<Alternative Configuration 4>

In the embodiment, the PC 10 and the audio interface device 14 are USB-connected by the USB cable 12. The form of connection is not limited to such a configuration, and the connection may be wired or wireless. The devices may be connected, for example, through Wi-Fi® or Bluetooth®. The signals transmitted and received between the PC 10 and the audio interface device 14 are: the immediate output signal (reproduction start command signal); the audio signal; the on-air signal (broadcast start/stop command signal); and the like. Any connection form for transmitting and receiving these signals may be employed.

<Alternative Configuration 5>

In the embodiment, the audio system comprising the PC 10 and the audio interface device 14 is exemplified. The embodiment of the present disclosure is not limited to such a configuration, and may be applied to any electronic device having a plurality of operation switches having a resistive pressure-sensing element; more specifically, an audio device, a remote control device, or an audio system having these devices. In other words, the PC 10 may be an audio device having output and reproduction functions of an audio signal, and the audio interface device 14 may be a remote control which controls the audio device.

The invention claimed is:

1. An electronic device that makes uniform pressing sensitivities of operation switches, the electronic device comprising:
   a first operation switch that outputs a first output value corresponding to a first pressing force applied to the first operation switch;
   a second operation switch that outputs a second output value corresponding to a second pressing force applied to the second operation switch; and
   a controller which, in operation, converts each of the first output value and the second output value to a level value among a plurality of level values using a plurality of conversion tables, wherein the plurality of conversion tables include a first conversion table associated with the first operation switch and a second conversion table associated with the second operation switch, the first conversion table being different from the second conversion table,
   wherein the controller, uses the first and second conversion tables to convert the first output value and the second output value for a same pressing force to a same level value.

2. The electronic device according to claim 1, wherein the controller creates the first conversion table using at least two first output values when at least two predetermined pressing forces are applied to the first operation switch and creates the second conversion table using at least two second output values when the at least two predetermined pressing forces are applied to the second operation switch.

3. The electronic device according to claim 2, further comprising:
   a display that displays a notification that the first or the second conversion table has been created, in response to a particular operation by the user.

4. The electronic device according to claim 1, wherein the first operation switch and the second operation switch are immediate output switches, each of the immediate output switches outputting to an external computer a reproduction start command signal of an audio file which is assigned in advance.

5. The electronic device according to claim 1, wherein the controller creates the second conversion table by setting a pressing sensitivity characteristic for the first operation switch as a reference, and matching a pressing sensitivity characteristic for the second operation switch with the pressing sensitivity characteristic for the first operation switch.

* * * * *